United States Patent [19]

Mahmoud

[11] Patent Number: 4,954,226

[45] Date of Patent: Sep. 4, 1990

[54] ADDITIVE PLATING BATH AND PROCESS

[75] Inventor: Issa S. Mahmoud, Austin, Tex.

[73] Assignee: International Business Machines Corporation, Armonk, N.Y.

[21] Appl. No.: 427,922

[22] Filed: Oct. 25, 1989

Related U.S. Application Data

[63] Continuation-in-part of Ser. No. 289,995, Dec. 21, 1988, abandoned.

[51] Int. Cl.$^5$ ............... C25D 3/38; C25D 7/00
[52] U.S. Cl. ...................... 204/15; 204/29; 204/52.1
[58] Field of Search ............... 204/52.1, 15, 29

[56] References Cited

U.S. PATENT DOCUMENTS

| | | | |
|---|---|---|---|
| 3,769,179 | 10/1973 | Durose et al. | 204/24 |
| 3,923,613 | 12/1975 | Immel | 204/52 |
| 4,242,181 | 12/1980 | Malak | 204/52 |
| 4,270,985 | 6/1981 | Lipson et al. | 204/15 |
| 4,576,685 | 3/1986 | Goffredo et al. | 204/30 |
| 4,755,265 | 7/1988 | Young | 204/45.1 |

FOREIGN PATENT DOCUMENTS 901363  1/1982  U.S.S.R. ............... 204/52.1

OTHER PUBLICATIONS

"Qualification & Performance of Polymer Thick Film Printed Boards", IPC-TF-870, Sep. 1988.

*Primary Examiner*—G. L. Kaplan
*Attorney, Agent, or Firm*—Andrea P. Bryant

[57] ABSTRACT

An additive plating bath and process are described for use in printed circuit manufacturing for applying copper to thick film patterns, said bath includes a low concentration of sulfuric acid, copper sulfate, urea, glycerin and a surface active agent in an aqueous solution.

10 Claims, No Drawings

ADDITIVE PLATING BATH AND PROCESS

This application is a continuation-in-part of Ser. No. 07/289,995 filed Dec. 21, 1988 and now abandoned.

BACKGROUND OF THE INVENTION

1. Field of the Invention

The present invention relates to printed circuit manufacturing techniques. More particularly, it relates to additive plating on polymer or ceramic thick film circuitry patterns.

2. Description of the Prior Art

Conventional circuit manufacturing processes for printed circuit boards involve the use of subtractive processes in which several steps take place, including activation, sensitization, electroless and electrolytic plating, photo imaging, and etching. As a result of carrying out these steps, significant amounts of waste materials are generated and the handling thereof directly increases overall cost of manufacturing.

Recently industry has considered additive circuitizing techniques in order to minimize chemical waste handling, reduce overall costs, and improve product yield. Using this additive approach, a conductive polymer paste is used to print circuit patterns on the substrate. Thereafter, generally electroless plating is done. The need for electroless plating proceeds from the presence of a thin oxide layer on the metallic fillers and a possible skin effect by the polymer binder.

This situation again results in excessive chemical waste and potential reliability problems, such as adhesion failure due to the high operating temperatures associated with most electroless plating baths and processes.

Additional problems may arise in the nature of film degradation due to the possibility of chemical reactions between the thick film polymer binder and conventionally high alkaline electroless plating bath solutions.

These problems are primary reasons for the limited application and utilization of additive processes in electrical circuitry manufacture. At present, such conductive polymer additive circuitizing is used in low power applications such as consumer products.

U.S. Pat. No. 4,270,985 to Lipson et al relates to screen printing photopolymerizable inks. There is a teaching of electroplating screen printed substrate in a bath containing copper sulfate, sulfuric acid and a brightener, for thirty minutes at 25 degrees centigrade, with an applied current of 30 amperes per square foot. Lipson et al discloses several electroplating baths, one of which is an acid copper bath containing 215 grams per liter of sulfuric acid, which is a very high concentration, so high as to adversely affect a polymer thick film. A current density of 30 amps per square foot is also extremely high due to the inherent electrical resistance of polymer thick films, for use therewith. Further, the disclosed surface conditioning, plating and etching steps preclude the use of certain circuit substrates such as anodic alumina and similar materials sensitive to high alkaline solutions.

U.S. Pat. No. 3,769,179 to Durose et al relates to a copper plating process for perforated printed circuit boards and discloses a high acid, low copper bath, preferably including one or more grain refining agents. A high acid content would degrade the polymer binder if the bath were used to plate on polymer thick films. However, U.S. Pat. No. 4,242,181 to Malak also relates to copper plating printed circuit boards and discloses improvements to the Durose et al high acid, low copper, electroplating bath wherein coffee is added to the bath as a grain refining agent.

U.S. Pat. No. 3,923,613 to Immel relates to an acidic, galvanic, high luster copper bath, including organic sulfonic acids or the salts thereof and/or non-ionogenic wetting agents, the improvement provided by adding urea thereto.

It is an object of the present invention to provide a plating bath suitable for plating polymer thick film materials. Such a bath requires a special chemistry which does not degrade the polymer binder and yet is aggressive enough to remove any oxide layered on the metallic filler.

SUMMARY OF THE INVENTION

The present invention minimizes manufacturing steps by eliminating the requirement for etching, as well as minimizing the cost associated with waste treatment.

The present invention overcomes the above noted prior art problems by providing a solution which enables the extension of polymer film additive circuitizing technology to universal applicability on many circuit substrate types, including an anodized aluminum substrates.

In the present invention, a conductive thick film is screened in the desired circuit pattern onto the circuit substrate (curing step follows). No surface conditioning, etching or electroless plating is required.

An acid copper plating bath having a low sulfuric acid concentration and including inhibiting agents is provided. A 10 amp current density is adequate to assure satisfactory plating. The relatively low concentration of sulfuric acid substantially eliminates the detrimental effects to the thick film circuit pattern.

Circuit substrates plated in accordance with the present invention experience excellent adhesion and coverage even after harsh environmental testing such as thermal aging and temperature/humidity cycling.

The novel manufacturing process of the invention includes the steps of printing the circuit pattern using either polymer or ceramic thick films. The choice is influenced by the substrate itself. Polymer thick films may be used on all substrate types, whereas ceramic thick films are used on alumina and similar high temperature material substrates.

The invention contemplates a design of circuit pattern bus bars and connection points so that current density is equally distributed to all of the circuit pattern. The substrate bearing circuitry to be plated is attached to the plating rack at the bus bar points and placed in the novel plating solution of the present invention.

The aqueous plating solution has the following formulation but may be scaled to the desired quantity. Sulfuric acid, 0.5–0.75 mol; hydrated copper sulfate, 0.3–0.50 mol; urea, 1–2 g/l; glycerin, 2–3 ml/l; surface active agent, 0.5–1.0 ml/l; and deionized water.

The parts to be plated are left in the plating bath for a short time before a negative bias is applied. Plating is carried out at a temperature 20–30 degrees centigrade with a current density of 10–40 amps/sq. ft. for a variable period determined by the desired coating thickness with mild to moderate agitation during plating. After desired plating thickness is obtained, the parts are removed from the plating container and thoroughly rinse in deionized water.

DESCRIPTION OF THE PREFERRED EMBODIMENT

The plating bath of the invention is prepared as follows:

Each of the components listed below with their quantities are added to the deionized water in the sequence listed. The solution is stirred during and after mixing for 20-30 minutes. Thereafter, filtering the solution removes any undissolved particles. The component list follows:

A. sulfuric acid, 0.50-0.75 mols
B. copper sulfate (hydrated), 0.3-0.50 mols
C. urea, 1-2 g/l
D. glycerin, 2-3 ml/l
E. surface active agent, 0.5-1.0 ml/l
F. deionized water, 800-850 ml It has been found that TERGITOL (trademark of Union Carbide) is a suitable surface agent although other cationic surface agents may be used.

Glycerin is included in the bath to prevent any reaction between the polymer or ceramic binders and sulfuric acid. In effect, glycerin acts as a retarding or inhibiting agent by coating the binder. No harsh or strong organic solvents are included in the bath since they might swell the polymer binder. Their absence prevents potential adhesion problems at the substrate—thick film or thick film-copper interfaces. The urea and TERGITOL are levelling and surface active agents, respectively, which ensure even, smooth deposits.

The concentration of sulfuric acid, while sufficient for removing thin oxide layers present on metallic surfaces, thereby ensuring a clean metal surface at which metallic bonds may be established during plating, is also sufficiently dilute to fail to react with a polymer or ceramic binders.

The plating bath is mixed by adding the component chemicals to about 700 ml deionized water in the amounts and order listed above. Finally adjust bath volume to one liter by adding sufficient deionized water. The solution is stirred during and after mixing for 20-30 minutes. A filtering step follows for removing any undissolved particles.

Prescreened and racked parts are placed in a container containing the plating bath where they remain undisturbed for 1-2 minutes. It is during this presoak period that the sulfuric acid bath is believed to remove any oxide layers present.

After the presoak period, negative bias is applied to the part. Thereafter, plating is allowed to continue until a predetermined desired thickness is obtained. Throughout the plating period, mild to moderate agitation is provided. The bath is then sufficiently agitated to maintain proper bath concentration, that is to prevent concentration polarization. The bath is maintained at a temperature in the range of from about 20 to about 30 degrees centigrade at a current density of 10-40 amps per square foot.

The following examples illustrate the various aspects of the invention.

EXAMPLE 1

An acid copper plating bath was prepared and subsequently was used to plate ceramic thick films on alumina and polymer thick films on anodized aluminum without conditioning of the thick film surface. The plating solution consisted of the following:

Sulfuric acid, 0.75 mols
Copper sulfate, 0.30 mols
Urea, 0.07 mols
Glycerin, 0.02 mols
Surfactant, 2 ml
Deionized water, 800 ml After mixing the above solution, plating was carried out at 25 degrees centigrade temperature and at 25 amps per square foot current density. The plated articles exhibited smooth copper deposits strongly bonded to the thick film conductors.

EXAMPLE 2

The same materials and operating conditions as in Example 1 were used except the current density was increased to 40 amps per square foot. The plated surfaces showed rough surface and were dull in appearance.

EXAMPLE 3

Another example of this invention was made to determine if surface conditioning was needed prior to plating. Thermally aged polymer and also ceramic thick films circuitized workpieces were plated as in Example 1 with one difference. The workpieces were left in the plating solution for about one minute prior to the application of a negative bias. The plating deposits showed excellent adhesion on both the ceramic and the polymer thick film circuitry.

EXAMPLE 4

Another example of this invention was plating in the following compositions:

Sulfuric acid, 0.50 mols.
Copper sulfate, 0.30 mols
Urea, 0.05 mols
Glycerin, 0.02 mols.
Surfactant, 1% by volume
Deionized water, 850 ml Plating the workpieces at room temperature and at 15-25 amps per square foot showed excellent copper to thick film adhesion.

EXAMPLE 6

As another example of this invention glycerin was not included in the previously successful formulation as noted in the other examples. After prolonged plating time, the thick film circuitry showed slight deterioration which resulted in poor adhesion.

Thus it can be seen that the present invention provides a new additive plating bath and process applicable to plating both polymer and ceramic thick film materials on various substrate materials. This additive plating process eliminates the prior art etching steps, effluents associated therewith, and the costs associated with handling these effluents in conventional circuit manufacturing processes. Further, it provides a superior alternative to conventional electroless plating techniques and other surface treatments associated with polymer thick film materials.

Thus, while the invention has been described having reference to a particular embodiment, those having skill in the art will appreciate that various minor changes and detail may be made without departing from the spirit and scope of the invention as claimed.

I claim:

1. An additive copper plating bath for plating copper for printed circuitry consisting essentially of:

an aqueous solution of from about 0.50 to about 0.75 mols sulfuric acid; from about 0.3 to about 0.50 mols copper sulfate; from about 1 to about 2 g/l urea, from about 2 to about 3 ml/l glycerin; and from about 0.5 to about 1.0 ml/l surface active agent and sufficient deionized water to make one liter.

2. A method of copper plating of thick film patterns on workpieces for use in printed circuit manufacturing, comprising the step of:
    immersing the workpieces in an aqueous bath comprising,
    sulfuric acid; from about 0.50 to about 0.75 mols,
    copper sulfate, from about 0.3 to about 0.50 mols,
    urea, from about 1 to about 2 g/l,
    glycerin, from about 2 to about 3 ml/l,
    a surface active agent, from about 0.5 to about 1 ml/l,
    maintaining the bath at a temperature in the range of from about 20 to about 30 degrees centigrade, at a current density in a range of from about 10 to about 40 amps per square foot with agitation, for a period of duration determined as a function of the desired plating thickness.

3. The method of claim 2, including the additional step of:
    soaking the workpieces in the bath for a period of 1 to 2 minutes before
    applying a negative bias to the workpiece.

4. The method of claim 2 wherein said thick film is a polymer thick film.

5. The method of claim 2 wherein said thick film is a ceramic thick film.

6. The methods of claims 2, 3, 4 or 5 wherein the temperature is 25 degrees centigrade and the current density is 25 amperes per square foot.

7. A method of electroplating thick film circuitry on substrates with copper comprising:
    preparing an aqueous bath including
    0.50 to 0.75 mols sulfuric acid,
    0.30 to 0.50 mols hydrated copper sulfate,
    0.05 to 0.10 mols urea,
    0.02 to 0.03 mols glycerin,
    1% by volume, surfactant; and
    electrodepositing a layer of copper on said thick film circuitry from the bath at a current density of between 15 and 25 amperes per square foot and at a bath temperature substantially equal to room temperature.

8. The method of claim 7 wherein the preparing step includes:
    adding the bath components to about 700 ml deionized water in the sequence of 7;
    stirring the bath for 20-30 minutes; and
    adding sufficient deionized water to adjust bath volume to one liter.

9. The method of claim 7 including between the steps of preparing and electrodepositing:
    soaking said substrates in the bath for 1-2 minutes.

10. The methods of claims 7 or 9 wherein the electrodepositing step includes:
    gently agitating said bath.

* * * * *